United States Patent
Kataoka et al.

(10) Patent No.: US 6,553,557 B1
(45) Date of Patent: Apr. 22, 2003

(54) INTER-FUNCTIONAL-BLOCK RESTRICTION HIGH-SPEED EXTRACTION METHOD AND RECORDING MEDIUM HAVING STORED THEREON AN INTER-FUNCTIONAL-BLOCK RESTRICTION HIGH-SPEED EXTRACTION PROGRAM

(75) Inventors: Sawako Kataoka, Kanagawa (JP); Yasuteru Makita, Kanagawa (JP)

(73) Assignee: NEC Corporation, Tokyo (JP)

( * ) Notice: Subject to any disclaimer, the term of this patent is extended or adjusted under 35 U.S.C. 154(b) by 155 days.

(21) Appl. No.: 09/709,640

(22) Filed: Nov. 13, 2000

(30) Foreign Application Priority Data

Nov. 12, 1999 (JP) .......................... 11-322637

(51) Int. Cl.[7] .............................. G06F 17/50
(52) U.S. Cl. ................... 716/18; 716/7; 716/6
(58) Field of Search ....................... 716/1–21

(56) References Cited

U.S. PATENT DOCUMENTS

| | | | | |
|---|---|---|---|---|
| 4,882,690 A | * | 11/1989 | Shinsha et al. ................. | 716/8 |
| 5,331,569 A | * | 7/1994 | Iijima .......................... | 716/18 |
| 5,333,032 A | * | 7/1994 | Matsumoto et al. ........... | 716/6 |
| 5,345,393 A | * | 9/1994 | Ueda ........................... | 702/120 |
| 5,926,396 A | * | 7/1999 | Ohara ......................... | 257/299 |
| 6,099,580 A | * | 8/2000 | Boyle et al. .................... | 716/7 |
| 6,237,125 B1 | * | 5/2001 | Masuda et al. ................. | 716/1 |
| 2001/0049815 A1 | * | 12/2001 | Shinomiya et al. ........... | 716/11 |
| 2001/0056568 A1 | * | 12/2001 | Hirotsu et al. ................. | 716/6 |
| 2002/0049958 A1 | * | 4/2002 | Shjimazawa ................. | 716/18 |

FOREIGN PATENT DOCUMENTS

| JP | 04-182874 | 6/1992 |
|---|---|---|
| JP | 10-187787 | 7/1998 |

* cited by examiner

*Primary Examiner*—Matthew Smith
*Assistant Examiner*—Andrea Liu
(74) *Attorney, Agent, or Firm*—Foley & Lardner (57) ABSTRACT

In an algorithm for a logic synthesis procedure in which the gate conversion and optimization are conducted according to boundary conditions and optimizing conditions of input/output interfaces set for each unit, timing restriction of boundary sections can be obtained in a short period of time from an RTL description before the logic synthesis is executed. A boundary section is extracted from the RTL description before execution of logic synthesis. Using the boundary section, the logic synthesis and a design budget are executed to obtain timing restriction for the boundary section.

14 Claims, 4 Drawing Sheets

INTER-FUNCTIONAL-BLOCK RESTRICTION HIGH-SPEED EXTRACTION METHOD AND RECORDING MEDIUM HAVING STORED THEREON AN INTER-FUNCTIONAL-BLOCK RESTRICTION HIGH-SPEED EXTRACTION PROGRAM

BACKGROUND OF THE INVENTION

The present invention relates to an inter-functional-block restriction high-speed extraction method and a recording medium having stored thereon an inter-functional-block restriction high-speed extraction program to obtain, in a logic synthesis procedure in which the gate conversion and optimization are conducted according to boundary conditions and optimizing conditions of input/output interfaces set for each unit under top-level restriction, timing restriction of boundary sections in a short period of time.

DESCRIPTION OF THE PRIOR ART

In the designing of semiconductor integrated circuits whose size has been increasing these days, a bottom-up procedure or a bottom-up compilation has been generally used in which functions are described and are compiled for each lower-level unit and then the functions resultant from the compilation are combined with each other for one chip.

In the bottom-up compilation, a large-sized semiconductor integrated circuit (design) is first subdivided into units such as functional blocks. For each lower unit, the compilation is conducted using top restriction describing boundary conditions of each input/output interface, optimizing conditions, and the like at a top level. In the compilation, the restriction at the top level as well as restriction for each lower-level unit are required.

When restrictions other than the top-level restriction are to be manually generated, there arise problems in the generation of restrictions. For example, restrictions cannot be easily predicted, creation of scripts takes a long period of time, and errors occurs easily. To solve these problems, there is required a function (to be referred to as "design budget" herebelow) to automatically generate restrictions for all levels from an upper-most level to a lower-most level or a unit level.

Figure 3:
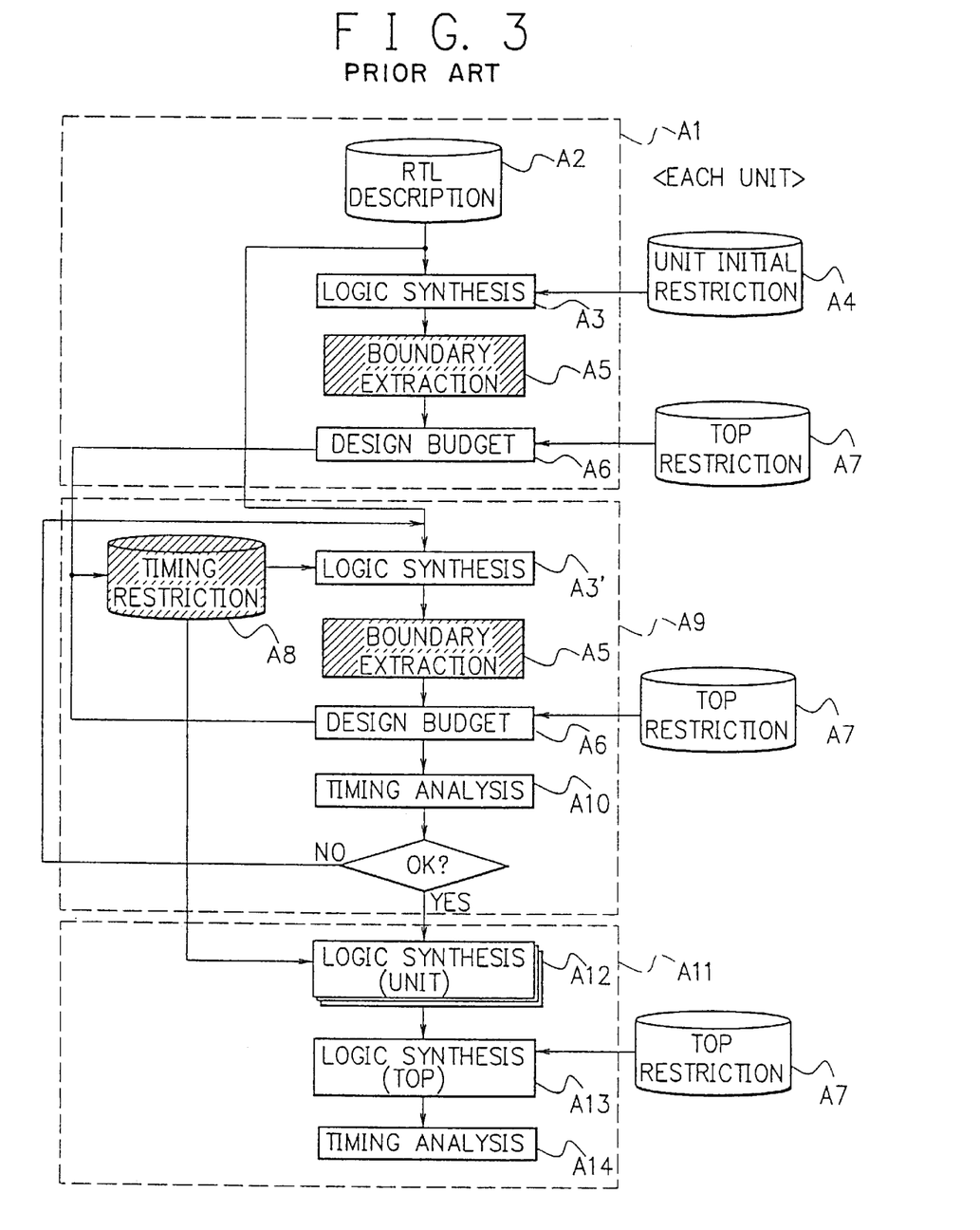
FIG. 3 is a flowchart showing an operation example of logic synthesis of the prior art.

FIG. 3 shows, in a flowchart, logic synthesis of the prior art in which a design budget is conducted at a gate level after logic synthesis. Namely, restrictions are generated for lower-level units according to top restriction A7 and timing is allocated to each unit also according to the top restriction A7.

Figure 2:
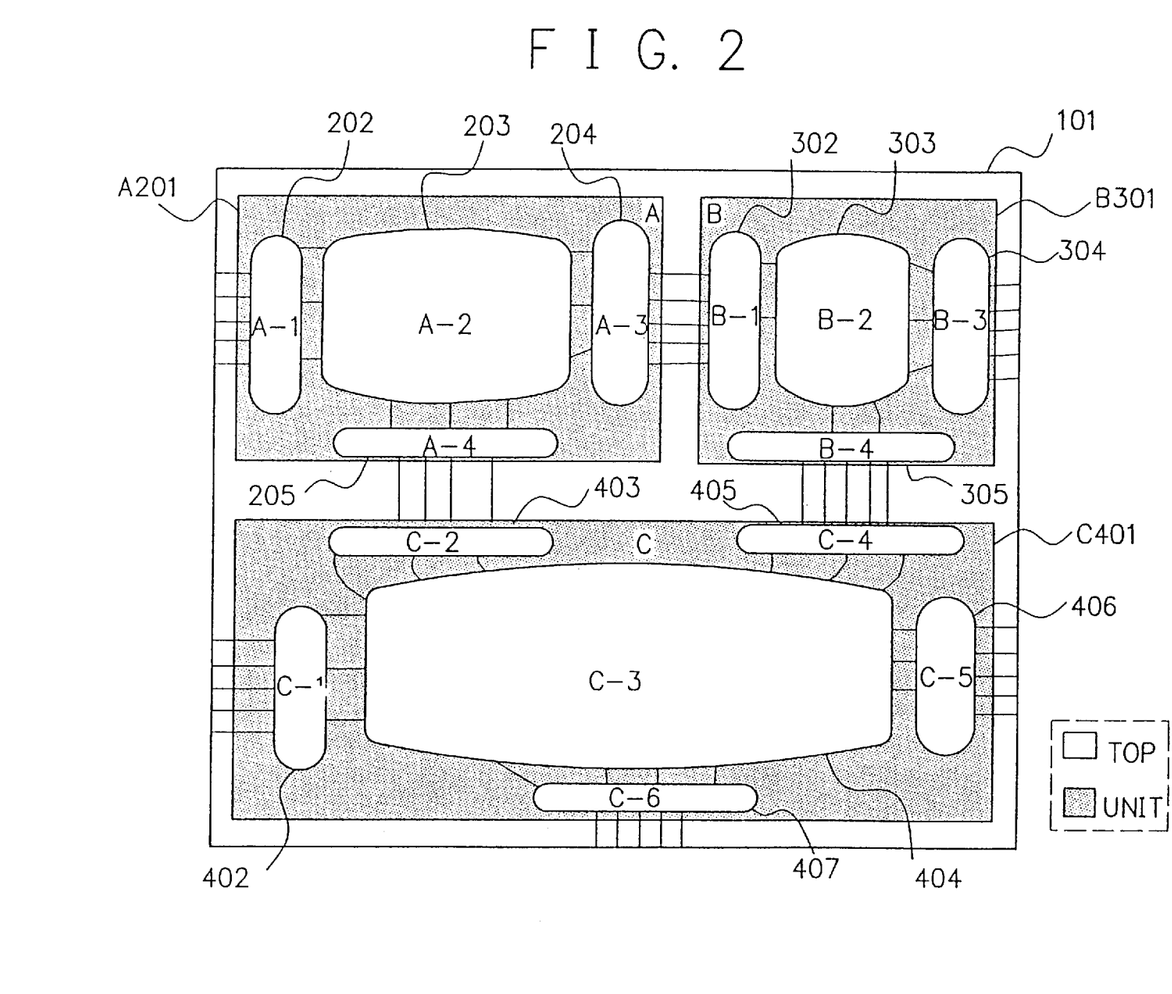
FIG. 2 is a schematic plan view showing a configuration of a semiconductor integrated circuit (design)

FIG. 2 schematically shows an example of a design 101 including units A201, B301 and C401. Each unit A201 to C401 includes a boundary section and an another section (an exception of the boundary section or no boundary section). The boundary section controls interfaces for external terminals in design or external input/output buffers and interfaces between units. The boundary section primarily has a function switching (or retiming) at particular clock timing, a signal inputted from a unit or a signal outputted to an external device. Details of the boundary section will be described later. The exception of the boundary section actually implements a primary function of the unit.

In the design 101, the unit A 201 includes boundary sections 202, 204, and 205 and no boundary section 203. The unit B 301 includes boundary sections 302, 304, and 305 and no boundary section 303. The unit C 401 includes boundary sections 402, 403, 405, 406, and 407 and no boundary section 404.

Since the timing restriction of each unit is related only to the interfaces between the units, the unit-level restriction is required for the boundaries of input/output interfaces 202, 204, 205, 302, 304, 305, 402, 403, 405, 406, and 407. The compilation is carried out for the overall design 101.

Referring to FIGS. 2 and 3, a logic synthesis procedure of the prior art will be described. The procedure generally includes a first procedure A1, a second procedure A9, and a third procedure A11. In the first procedure A1, register-transfer-level (RTL) description A2 and unit initial restriction A4 including simple restriction for synthesis of units A 201, B 301, and C 401 are inputted to execute a logic synthesis step A3.

To achieve a design budget step A6 for a design resultant from the logic synthesis step A3, a boundary extraction step A5 is conducted to extract the boundary sections 202, 204, 205, 302, 304, 305, 402, 403, 405, 406, and 407 of the respective units. Using the top restriction A7 as an input, the design budget step A6 is executed to resultantly produce timing restriction A8.

In the second procedure A9, the timing restriction A8 obtained by the first procedure A1 and the initial RTL description A2 are inputted to execute a logical synthesis step A3' for the units A 201, B 301, and C 401. For each design obtained by the step A3', the design budget step A6 is carried out using the TOP restriction A7 to generate timing restriction A8.

For the timing restriction A8, a timing analysis step A10 is executed to detect timing violation. If a timing violation is detected, control returns to the logical synthesis step A3'. When the number of execution of the second procedure A9 is increased, precision of the processing becomes higher.

In the third procedure A11, when a timing violation is not detected as a result of the timing analysis step A10 of the second procedure A9, timing restriction A8 resultant from the procedure A9 is inputted to execute a logical analysis step A12 for each unit. Using a design obtained by the step A12 and the top restriction A7, a logical analysis step A3 is executed for the top section and then a timing analysis step A14 is conducted.

Figure 4:
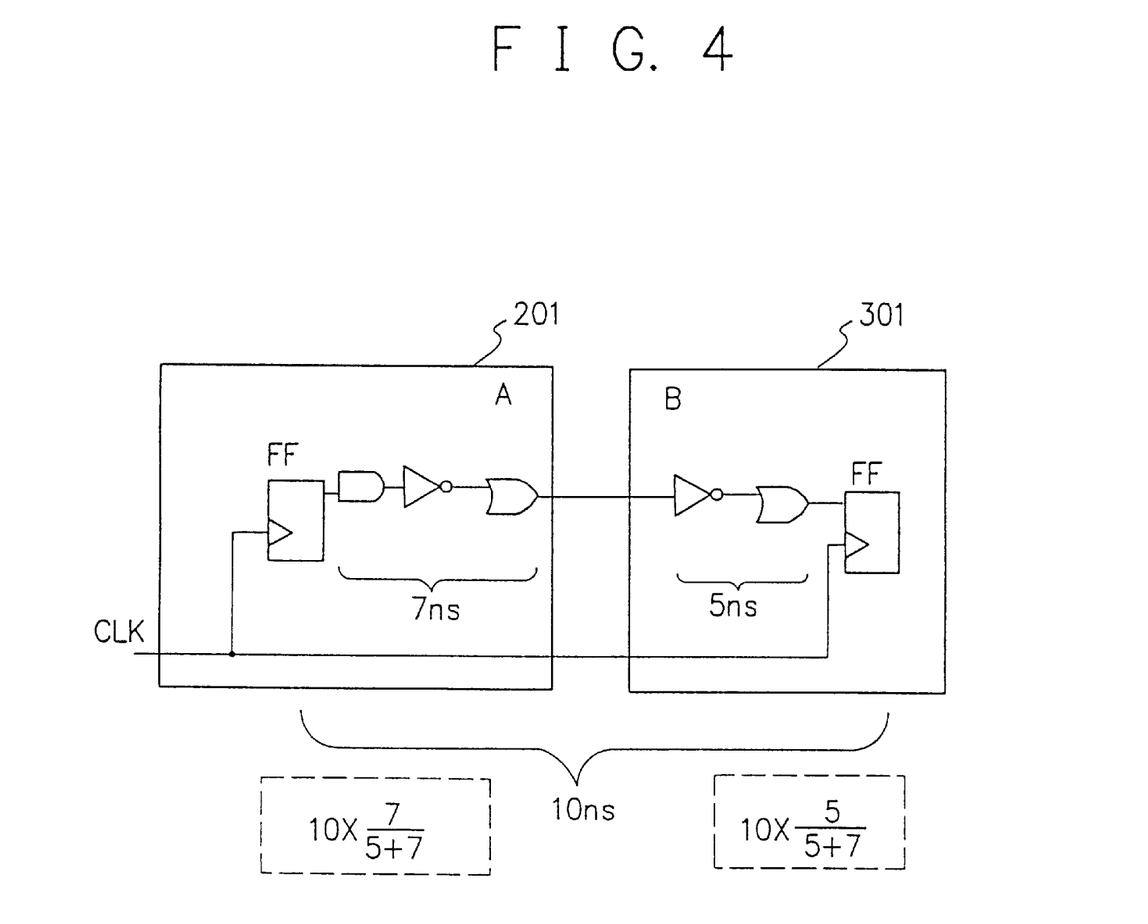
FIG. 4 is a circuit diagram partially showing constitution of boundaries between units.

Referring to FIGS. 2 and 4, description will be given of an example of allocation of timing to each unit according to the top restriction A7.

FIG. 4 partly shows a structural example of the boundary sections 204 and 302 respectively of the units A 201 and B 301 shown in FIG. 2. A synthesis step is first executed for each unit according to the unit initial restriction A4 to resultantly obtain delay information of the boundary sections 204 and 302. The values of delay are respectively 7 nanoseconds (ns) and 5 ns in this case.

Assume that the top restriction A7 indicates timing information of 10 ns between the units A 201 and B 301. In this situation, the delay is 12 ns for the restriction of 10 ns and hence a violation of 2 ns results. The top restriction is stipulated by the specifications and hence must be strictly observed.

When the violation of 2 ns is proportionally distributed to the units A 201 and B 301, $10 \times \{7/(5+7)\}$ and $10 \times \{5/(5+7)\}$ are allocated to the units A 201 and B 301, respectively. The sum of these values is 10 ns and hence the timing violation is avoided.

By executing the design budget A6, the boundary sections 202, 204, 205, 302, 304, 305, 402, 403, 405, 406, and 407 of the respective units are separated to optimize timing information for each unit. The logic synthesis procedure can also be applied to a large-sized design and minimizes the time required for manual operation in the synthesis.

However, the prior art is attended with the problem as follows. While the design of the logic circuit is increasing in size, it is required for the designer to minimize the time to complete the operation. In this situation, the machine to execute the logic synthesis and the like has not sufficient processing performance. Under the conditions in which time, disk capacity, and machine power are limited, a logic synthesis method has been desired to produce a result of synthesis at a high speed and with high precision while saving human power.

In the logic synthesis method of the prior art, the logic synthesis must be repeatedly carried out to generate restrictions for the lower units according to the TOP restriction A7. For each logic synthesis, the compilation must be conducted for all units of FIG. 2. However, the design budget to generate the restriction for a unit only requires information of the boundary section of the unit, and information regarding most part of the design synthesized is not used. Namely, to repetitiously compile information of all units is disadvantageous in consideration of time and the memory used for the compilation. This problem becomes more troublesome when the size of the design is increased.

Japanese Patent Application Laid-Open No. Hei 4-182874 describes a prior-art example of a logic synthesis procedure. In the procedure, information of boundary conditions and optimizing conditions for input/output interfaces specified for respective units are converted into information of gates and the gates are optimized according to the information.

In the prior art, the logic synthesis is accomplished according to the boundary conditions of input/output ports initially set for respective units and the optimizing conditions specified in advance. As a result, there is attained gate-level information. For each unit, boundary conditions of input/output ports are extracted from the gate-level information. Logic synthesis is repeatedly executed according to the extracted boundary conditions and the optimizing conditions to finally generate a circuit optimal in the circuit area and the operation speed.

Japanese Patent Application Laid-Open No. Hei 10-187787 describes a method of extracting a boundary section from an RTL description of each unit.

SUMMARY OF THE INVENTION

It is therefore an object of the present invention, which has been devised to solve the problem, to provide a high-speed inter-functional-block restriction extraction method and a recording medium having stored thereon high-speed inter-functional-block restriction extraction program in which timing restriction of a boundary section is obtained in a short period of time, using the prior art or another general method, from an RTL description before a logic synthesis is executed in a logic synthesis procedure to produce and to optimize information of gates according to boundary conditions and optimizing conditions of input/output interfaces set for respective units under top-level restriction.

To achieve the object in accordance with the present invention, there is provided an inter-functional-block restriction high-speed extraction method of converting, according to top restriction describing boundary conditions and optimizing conditions of boundary sections between units for a logic circuit described at a register transfer level, the register-transfer-level logic circuit into a gate-level logic circuit and of optimizing the gate-level logic circuit, comprising the following steps of:

extracting boundary sections from the logic circuit described at a register transfer level;

conducting logic synthesis only for the boundary sections extracted;

extracting timing restriction according to a design of each of the boundary sections resultant from the logic synthesis; and conducting logic synthesis at a unit level when no timing violation is detected according to the timing restriction extracted and/or conducting logic synthesis at a unit level when timing violation is detected according to the timing restriction extracted, again the logic synthesis using the timing restriction as an input thereto;

extracting timing restriction according to a design of the boundary section resultant from the logic synthesis; and determining whether or not timing violation is detected according to the timing restriction extracted.

The inter-functional-block restriction high-speed extraction method in accordance with claim 1, the timing restriction is obtained by executing a design budget according to the top restriction, using the design resultant from the logic synthesis as an input thereto is preferred.

In accordance with the present invention, there is provided an inter-functional-block restriction high-speed extraction method of converting, according to top restriction describing boundary conditions and optimizing conditions of boundary sections between units for a logic circuit described at a register transfer level, the register-transfer-level logic circuit into a gate-level logic circuit and of optimizing the gate-level logic circuit, comprising the following steps of:

extracting, using the register-transfer-level logic circuit as an input thereto, boundary sections from the register-transfer-level logic circuit;

conducting, using the boundary sections extracted, first logic synthesis only for the boundary sections according to unit initial restriction;

executing, using a design resultant from the first logic synthesis, a first design budget according to the top restriction;

executing, using timing restriction resultant from the first design budget, second logic synthesis;

executing, using a design resultant from the second logic synthesis, a second design budget according to the top restriction;

determining, according to timing restriction resultant from the second design budget, whether or not timing violation is present;

conducting logic synthesis at a unit level when no timing violation is present as a result of the determination and/or conducting, when timing violation is present according to the timing restriction resultant from the second design budget, again the second logic synthesis using the timing restriction as an input thereto.

It is preferred that pre-described in the inter-functional-program restriction high-speed extraction method the unit-level logic synthesis includes the steps of:

conducting logic synthesis for each logic unit using as an input thereto the timing restriction and the register-transfer-level logic circuit; and conducting logic synthesis according to the top restriction is preferred.

In accordance with the present invention, there is provided an inter-functional-block restriction high-speed extraction method of converting, according to top restriction describing boundary conditions and optimizing conditions of boundary sections between units for a logic circuit described at a register transfer level, the register-transfer-level logic circuit into a gate-level logic circuit and of optimizing the gate-level logic circuit, the method consisting first, second and third process wherein;

said first process comprising the following steps of:
extracting, using the register-transfer-level logic circuit as an input thereto, boundary sections from the register-transfer-level logic circuit;
conducting, using the boundary sections extracted, first logic synthesis only for the boundary sections according to unit initial restriction; and
executing, using a design resultant from the first logic synthesis, a first design budget according to the top restriction;

said second process executing two times or more and comprising the following steps of:
executing, using timing restriction resultant from the first design budget, second logic synthesis;
executing, using a design resultant from the second logic synthesis, a second design budget according to the top restriction;
determining, according to timing restriction resultant from the second design budget, whether or not timing violation is present;
conducting, when timing violation is present according to the timing restriction resultant from the second design budget, again the second logic synthesis using the timing restriction as an input thereto.

The inter-functional-program restriction high-speed extraction method, the unit-level logic synthesis includes the steps of:
conducting logic synthesis for each logic unit using as an input thereto the timing restriction and the register-transfer-level logic circuit; and
conducting logic synthesis according to the top restriction is preferred. And the inter-functional-program restriction high-speed extraction method, the third process comprising the steps of:
conducting logic synthesis at a unit level, when no timing violation is detected in the timing analysis step, using as an input thereto the updated timing restriction and the logic circuit described resister transfer level description;
conducting logic synthesis at a top level using the top restriction and given data by conducting logic synthesis at a unit level; and then
executing timing analysis is preferred.

In accordance with the present invention, there is provided a recording medium having stored thereon an inter-functional-program restriction high-speed extraction program to convert, according to top restriction describing boundary conditions and optimizing conditions of boundary sections between units for a logic circuit described at a register transfer level, the register-transfer-level logic circuit into a gate-level logic circuit and to optimize the gate-level logic circuit, the program conducting:
extracting boundary sections from the logic circuit described at a register transfer level;
conducting logic synthesis only for the boundary sections extracted;
extracting timing restriction according to a design of each of the boundary sections resultant from the logic synthesis; and
conducting logic synthesis at a unit level when no timing violation is detected according to the timing restriction extracted and/or:
conducting, when timing violation is detected according to the timing restriction extracted, again the logic synthesis using the timing restriction as an input thereto;
extracting timing restriction according to a design of the boundary section resultant from the logic synthesis; and
determining whether or not timing violation is detected according to the timing restriction extracted.

The recording medium having stored thereon an inter-functional-program restriction high-speed extraction program, the program obtaining the timing restriction by executing a design budget according to the top restriction, using the design resultant from the logic synthesis as an input thereto is preferred.

In accordance with the present invention, there is provided a recording medium having stored thereon an inter-functional-program restriction high-speed extraction program to convert, according to top restriction describing boundary conditions and optimizing conditions of boundary sections between units for a logic circuit described at a register transfer level, the register-transfer-level logic circuit into a gate-level logic circuit and to optimize the gate-level logic circuit, the program conducting the following steps of:
extracting, using the register-transfer-level logic circuit as an input thereto, boundary sections from the register-transfer-level logic circuit;
conducting, using the boundary sections extracted, first logic synthesis only for the boundary sections according to unit initial restriction;
executing, using a design resultant from the first logic synthesis, a first design budget according to the top restriction;
executing, using timing restriction resultant from the first design budget, second logic synthesis;
executing, using a design resultant from the second logic synthesis, a second design budget according to the top restriction;
determining, according to timing restriction resultant from the second design budget, whether or not timing violation is present; and
conducting logic synthesis at a unit level when no timing violation is present as a result of the determination and/or;
conducting, when timing violation is present according to the timing restriction resultant from the second design budget, again the second logic synthesis using the timing restriction as an input thereto.

The recording medium having stored thereon an inter-functional-program restriction high-speed extraction program, the program conducting the following steps of:
conducting logic synthesis for each logic unit using as an input thereto the timing restriction and the register-transfer-level logic circuit; and
conducting logic synthesis according to the top restriction is preferred.

In accordance with the present invention, there is provided a recording medium having stored thereon an inter-functional-program restriction high-speed extraction program to convert, according to top restriction describing boundary conditions and optimizing conditions of boundary sections between units for a logic circuit described at a register transfer level, the register-transfer-level logic circuit into a gate-level logic circuit and to optimize the gate-level logic circuit, the program conducting the following steps of:

extracting, using the register-transfer-level logic circuit as an input thereto, boundary sections from the register-transfer-level logic circuit;

conducting, using the boundary sections extracted, first logic synthesis only for the boundary sections according to unit initial restriction; and executing, using a design resultant from the first logic synthesis, a first design budget according to the top restriction;

said second process executing two times or more and comprising the following steps of:

executing, using timing restriction resultant from the first design budget, second logic synthesis;

executing, using a design resultant from the second logic synthesis, a second design budget according to the top restriction;

determining, according to timing restriction resultant from the second design budget, whether or not timing violation is present;

conducting, when timing violation is present according to the timing restriction resultant from the second design budget, again the second logic synthesis using the timing restriction as an input thereto.

The recording medium having stored thereon an inter-functional-program restriction high-speed extraction program, the program conducting the following steps of:

conducting logic synthesis for each logic unit using as an input thereto the timing restriction and the register-transfer-level logic circuit; and conducting logic synthesis according to the top restriction is preferred. And the recording medium having stored thereon an inter-functional-program restriction high-speed extraction program, the program conducting the following steps of:

conducting logic synthesis at a unit level, when no timing violation is detected in the timing analysis step, using as an input thereto the updated timing restriction and the logic circuit described resister transfer level description;

conducting logic synthesis at a top level using the top restriction and given data by conducting logic synthesis at a unit level; and then executing timing analysis is preferred.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring next to the accompanying drawings, description will be given in detail of an embodiment in accordance with the present invention.

Figure 1:
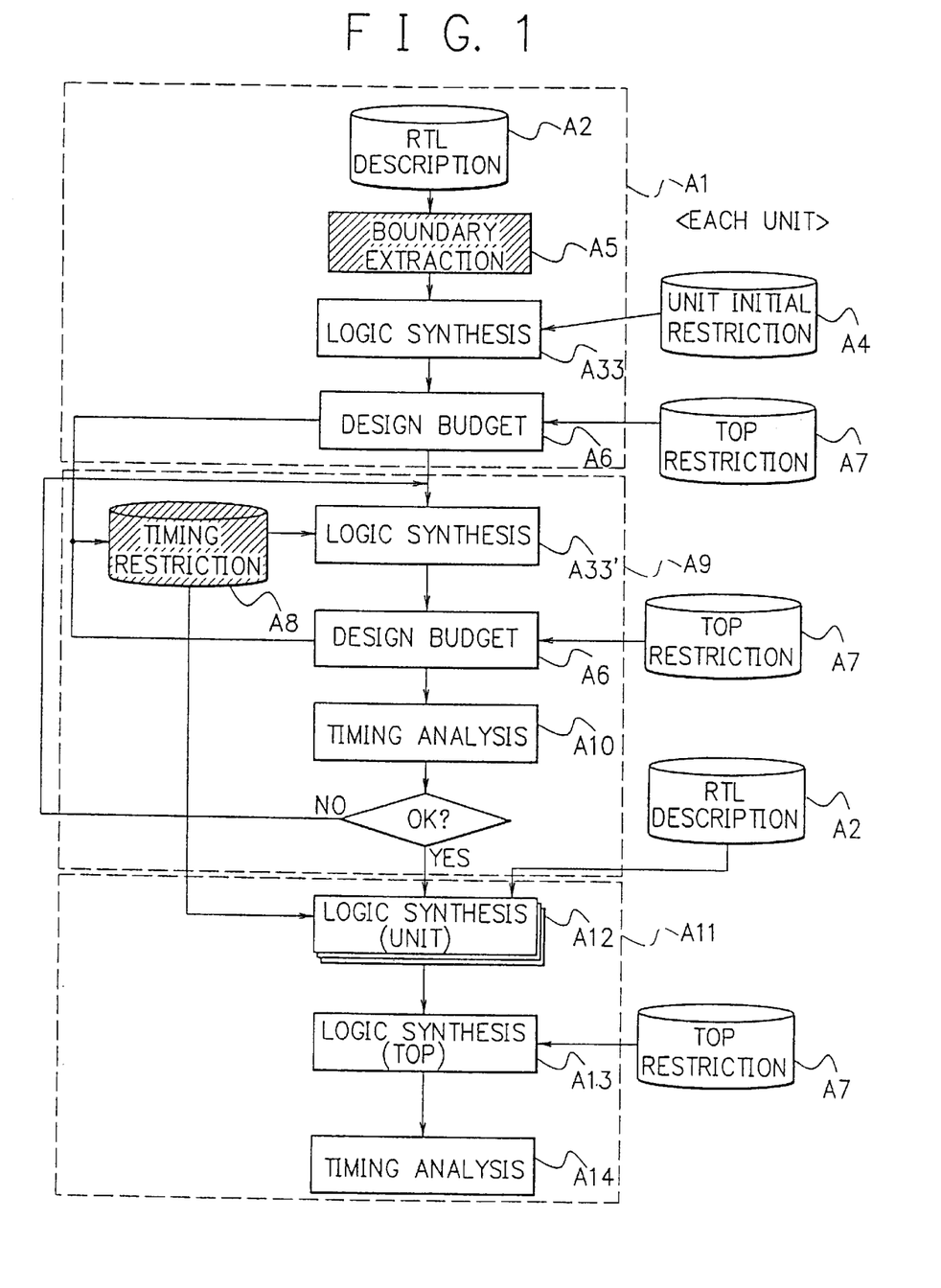
FIG. 1 is a flowchart showing operation of logic synthesis in an embodiment in accordance with the present invention.

FIG. 1 shows, in a flowchart, an embodiment of logic synthesis according to the present invention. Description will be given of a logic synthesis procedure in the embodiment by referring to FIGS. 1 and 2.

In a first procedure A1, an RTL description A2 of each unit is inputted to execute a boundary extraction step A5 to extract boundary sections 202, 204, 205, 302, 304, 305, 402, 403, 405, 406, and 407 shown in FIG. 2. Using unit initial restriction A4, a logic synthesis step A33 is executed to obtain a design. A design budget step A6 is executed using the design according to top restriction A7 to attain timing restriction A8.

In a second procedure A9, a logic synthesis step A33' is again executed using the timing restriction A8 produced by the first procedure A1. Using given data which is executed using the timing restriction A8, the design budget A6 is executed according to the top restriction A7 to obtain timing restriction A8 (updated timing restriction A8). A timing restriction step A10 is then executed for the timing restriction A8. If a timing violation is detected in the step A10, control is returned to execute the logic synthesis step A33' using the timing restriction A8. Precision of the results becomes higher by increasing the number of execution of the second procedure A9.

In a third procedure A11, when no timing violation is detected in the timing analysis step A10, the logic synthesis step A12 is executed for each unit using the timing restriction A8 and the RTL description A2 same as used in the first procedure, for the unit. The logic synthesis step A12 is carried out using the TOP restriction A7 and then a timing analysis step A14 is executed.

As can be seen from the third procedure, the unit-level synthesis is executed only once in the third procedure A11 and the execution time is therefore minimized. Although the second procedure A9 is repetitiously executed to increase the timing precision, the procedure A9 is executed only for the design regarding the boundary section extracted and hence the operation time is also reduced.

In accordance with the present invention, when the unit areas are increased in an order of the units B 301, A 201, and C 401, the areas of the another sections A 203, B 303, and C 404 excepting the boundary sections become greater. The synthesis is not required for most areas of the unit C 401. In the prior art, a considerable period of time and a large memory are consumed for the synthesis of the areas. In accordance with the embodiment, only the necessary sections (boundary sections) are used for the synthesis. Therefore, when the design is greater, the present invention becomes more advantageous.

According to logic synthesis using actual data in accordance with the present invention in which the overall area is 22768 grids and the area of the extraction section is 8437 grids, when data of the extraction section is 2.7 times, the logic synthesis time is minimized to 4 minutes 39 seconds in comparison with 24 minutes and 6 seconds in the prior art. Namely, the minimization factor is 5.18 (times). The logic synthesis uses data for a relatively small design. The minimization factor is increased when the design size becomes greater as described above.

In accordance with the present invention, in a logic synthesis in which the gate conversion and optimization are conducted according to boundary conditions and optimizing conditions of input/output interfaces set for each unit under TOP level restriction, the sections for which the logic synthesis is executed is minimized from the overall units to minimum sections necessary to generate inter-unit restrictions. Therefore, it is possible to extract and to set restrictions at the unit level at a high speed and the memory area used by the machine can be minimized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An inter-functional-block restriction high-speed extraction method of converting, according to a top restriction describing boundary conditions and optimizing conditions of boundary sections between units for a logic circuit described at a register transfer level, the register-transfer-level logic circuit into a gate-level logic circuit and of optimizing the gate-level logic circuit, comprising the following steps of:

extracting boundary sections from the logic circuit described at a register transfer level;

conducting logic synthesis only for the boundary sections extracted;

extracting a timing restriction according to a design of each of the boundary sections resultant from the logic synthesis; and conducting logic synthesis at a unit level when no timing violation is detected according to the timing restriction extracted and/or conducting logic synthesis at a unit level when a timing violation is detected according to the timing restriction extracted, the logic synthesis using the timing restriction as an input thereto;

extracting a timing restriction according to a design of the boundary section resultant from the logic synthesis; and determining whether or not a timing violation is detected according to the timing restriction extracted.

2. An inter-functional-block restriction high-speed extraction method in accordance with claim 1, wherein the timing restriction is obtained by executing a design budget according to the top restriction, using the design resultant from the logic synthesis as an input thereto.

3. An inter-functional-block restriction high-speed extraction method of converting, according to a top restriction describing boundary conditions and optimizing conditions of boundary sections between units for a logic circuit described at a register transfer level, the register-transfer-level logic circuit into a gate-level logic circuit and of optimizing the gate-level logic circuit, comprising the following steps of:

extracting, using the register-transfer-level logic circuit as an input thereto, boundary sections from the register-transfer-level logic circuit;

conducting, using the boundary sections extracted, first logic synthesis only for the boundary sections according to a unit initial restriction;

executing, using a design resultant from the first logic synthesis, a first design budget according to the top restriction;

executing, using a timing restriction resultant from the first design budget, second logic synthesis;

executing, using a design resultant from the second logic synthesis, a second design budget according to the top restriction;

determining, according to a timing restriction resultant from the second design budget, whether or not a timing violation is present;

conducting logic synthesis at a unit level when no timing violation is present as a result of the determination and/or conducting, when a timing violation is present according to the timing restriction resultant from the second design budget, again the second logic synthesis using the timing restriction as an input thereto.

4. An inter-functional-program restriction high-speed extraction method in accordance with claim 3, wherein a unit-level logic synthesis includes the steps of:

conducting logic synthesis for each logic unit using as an input thereto the timing restriction and the register-transfer-level logic circuit; and conducting logic synthesis according to the top restriction.

5. An inter-functional-block restriction high-speed extraction method of converting, according to a top restriction describing boundary conditions and optimizing conditions of boundary sections between units for a logic circuit described at a register transfer level, the register-transfer-level logic circuit into a gate-level logic circuit and of optimizing the gate-level logic circuit, the method consisting of a first and second process wherein;

said first process comprising the following steps of:

extracting, using the register-transfer-level logic circuit as an input thereto, boundary sections from the register-transfer-level logic circuit;

conducting, using the boundary sections extracted, first logic synthesis only for the boundary sections according to a unit initial restriction; and executing, using a design resultant from the first logic synthesis, a first design budget according to the top restriction;

said second process executing two times or more and comprising the following steps of:

executing, using a timing restriction resultant from the first design budget, second logic synthesis;

executing, using a design resultant from the second logic synthesis, a second design budget according to the top restriction;

determining, according to timing restriction resultant from the second design budget, whether or not timing violation is present;

conducting, when a timing violation is present according to the timing restriction resultant from the second design budget, again the second logic synthesis using the timing restriction as an input thereto.

6. An inter-functional-program restriction high-speed extraction method in accordance with claim 5, wherein a unit-level logic synthesis includes the steps of:

conducting logic synthesis for each logic unit using as an input thereto the timing restriction and the register-transfer-level logic circuit; and conducting logic synthesis according to the top restriction.

7. An inter-functional-program restriction high-speed extraction method in accordance with claim 5, further comprising a third process comprising the steps of:

conducting logic synthesis at a unit level, when no timing violation is detected in a timing analysis step, using as an input thereto an updated timing restriction and the logic circuit described register transfer level description;

conducting logic synthesis at a top level using the top restriction and given data by conducting logic synthesis at a unit level; and then executing timing analysis.

8. A recording medium having stored thereon an inter-functional-program restriction high-speed extraction program to convert, according to a top restriction describing boundary conditions and optimizing conditions of boundary sections between units for a logic circuit described at a register transfer level, the register-transfer-level logic circuit into a gate-level logic circuit and to optimize the gate-level logic circuit, the program conducting:

extracting boundary sections from the logic circuit described at a register transfer level;

conducting logic synthesis only for the boundary sections extracted;

extracting a timing restriction according to a design of each of the boundary sections resultant from the logic synthesis; and conducting logic synthesis at a unit level when no timing violation is detected according to the timing restriction extracted and/or:

conducting, when a timing violation is detected according to the timing restriction extracted, again the logic synthesis using the timing restriction as an input thereto;

extracting a timing restriction according to a design of the boundary section resultant from the logic synthesis; and determining whether or not a timing violation is detected according to the timing restriction extracted.

9. A recording medium having stored thereon an inter-functional-program restriction high-speed extraction program in accordance with claim 8, the program obtaining a the timing restriction by executing a design budget according to a top restriction, using the design resultant from the logic synthesis as an input thereto.

10. A recording medium having stored thereon an inter-functional-program restriction high-speed extraction program to convert, according to a top restriction describing boundary conditions and optimizing conditions of boundary sections between units for a logic circuit described at a register transfer level, the register-transfer-level logic circuit into a gate-level logic circuit and to optimize the gate-level logic circuit, the program conducting the following steps of:

extracting, using the register-transfer-level logic circuit as an input thereto, boundary sections from the register-transfer-level logic circuit;

conducting, using the boundary sections extracted, first logic synthesis only for the boundary sections according to unit initial restriction;

executing, using a design resultant from the first logic synthesis, a first design budget according to a top restriction;

executing, using a timing restriction resultant from the first design budget, second logic synthesis;

executing, using a design resultant from the second logic synthesis, a second design budget according to the top restriction;

determining, according to timing restriction resultant from the second design budget, whether or not a timing violation is present; and conducting logic synthesis at a unit level when no timing violation is present as a result of the determination and/or;

conducting, when a timing violation is present according to a timing restriction resultant from the second design budget, again the second logic synthesis using a timing restriction as an input thereto.

11. A recording medium having stored thereon an inter-functional-program restriction high-speed extraction program in accordance with claim 9, the program conducting the following steps of:

conducting logic synthesis for each logic unit using as an input thereto the timing restriction and the register-transfer-level logic circuit; and conducting logic synthesis according to the top restriction.

12. A recording medium having stored thereon an inter-functional-program restriction high-speed extraction program to convert, according to a top restriction describing boundary conditions and optimizing conditions of boundary sections between units for a logic circuit described at a register transfer level, the register-transfer-level logic circuit into a gate-level logic circuit and to optimize the gate-level logic circuit, the program conducting the following steps of:

extracting, using the register-transfer-level logic circuit as an input thereto, boundary sections from the register-transfer-level logic circuit;

conducting, using the boundary sections extracted, first logic synthesis only for the boundary sections according to unit initial restriction; and executing, using a design resultant from the first logic synthesis, a first design budget according to the top restriction;

said second process executing two times or more and comprising the following steps of:

executing, using a timing restriction resultant from the first design budget, second logic synthesis;

executing, using a design resultant from the second logic synthesis, a second design budget according to the top restriction;

determining, according to timing restriction resultant from the second design budget, whether or not a timing violation is present;

conducting, when a timing violation is present according to the timing restriction resultant from the second design budget, again the second logic synthesis using the timing restriction as an input thereto.

13. A recording medium having stored thereon an inter-functional-program restriction high-speed extraction program in accordance with claim 12, the program conducting the following steps of:

conducting logic synthesis for each logic unit using as an input thereto the timing restriction and the register-transfer-level logic circuit; and conducting logic synthesis according to the top restriction.

14. A recording medium having stored thereon an inter-functional-program restriction high-speed extraction program in accordance with claim 9, the program conducting the following steps of:

conducting logic synthesis at a unit level, when no timing violation is detected in the timing analysis step, using as an input thereto the updated timing restriction and the logic circuit described resister transfer level description;

conducting logic synthesis at a top level using the top restriction and given data by conducting logic synthesis at a unit level; and then executing a timing analysis.

* * * * *